US012696711B2

(12) United States Patent
Lee et al.

(10) Patent No.: US 12,696,711 B2
(45) Date of Patent: Jul. 28, 2026

(54) SUBSTRATE TREATING APPARATUS AND SUBSTRATE TREATING METHOD

(71) Applicant: SEMES CO., LTD., Chungcheongnam-do (KR)

(72) Inventors: Dong Hwa Lee, Chungcheongnam-do (KR); Dai Geon Yoon, Chungcheongnam-do (KR); Soo Hong Lee, Gyeonggi-do (KR); Ji Hyeon Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 1029 days.

(21) Appl. No.: 17/845,790

(22) Filed: Jun. 21, 2022

(65) Prior Publication Data
US 2023/0032943 A1 Feb. 2, 2023

(30) Foreign Application Priority Data
Jul. 28, 2021 (KR) ........................ 10-2021-0099089

(51) Int. Cl.
*B41J 2/17* (2006.01)
*B41J 2/175* (2006.01)
*H10P 72/00* (2026.01)

(52) U.S. Cl.
CPC ........ *H10P 72/0416* (2026.01); *B41J 2/1707* (2013.01); *B41J 2/17513* (2013.01);
(Continued)

(58) Field of Classification Search
None
See application file for complete search history.

(56) References Cited

U.S. PATENT DOCUMENTS

2014/0182626 A1* 7/2014 Hayashi ........... H01L 21/67051
134/18

FOREIGN PATENT DOCUMENTS

CN          107112231          8/2017
JP          11-245429          9/1999
(Continued)

OTHER PUBLICATIONS

Notice of Allowance for Korean Patent Application No. 10-2021-0099089 issued on Feb. 23, 2023 and its translation from Global Dossier.
(Continued)

*Primary Examiner* — Levon J Shahinian
(74) *Attorney, Agent, or Firm* — WOMBLE BOND DICKINSON (US) LLP

(57) ABSTRACT

Provided are a substrate treating apparatus and a substrate treating method capable of preventing settling of a chemical without using a stirrer. The substrate treating apparatus according to the present disclosure includes: a main tank in which a chemical for supplying to an inkjet head is stored; and a buffer tank including a space for storing the chemical to be supplied to the main tank, including a first outlet through which the chemical is discharged, a first inlet through which the chemical is introduced while forming a closed path with the first outlet so that the chemical is circulated without passing through the main tank, and second outlets for supplying the chemical to the main tank, and including a floor surface including a first vertex and a second vertex disposed to be spaced apart from the first vertex, wherein the first outlet is provided at a position closer to the first vertex than the second vertex, and the first inlet is provided at a position closer to the second vertex than the first vertex.

16 Claims, 8 Drawing Sheets

(52) U.S. Cl.
CPC ....... *B41J 2/17523* (2013.01); *B41J 2/17553*
(2013.01); *B41J 2/17596* (2013.01); *H10P*
*72/0402* (2026.01); *H10P 72/0414* (2026.01);
*H10P 72/0448* (2026.01)

(56) References Cited

FOREIGN PATENT DOCUMENTS

| | | |
|---|---|---|
| KR | 10-2010-0042447 | 4/2010 |
| KR | 10-2015-0073597 | 7/2015 |
| KR | 10-2018-0005025 | 1/2018 |
| KR | 10-2019-0079823 | 7/2019 |
| KR | 10-2019-0115339 | 10/2019 |
| KR | 10-2020-0070676 | 6/2020 |

OTHER PUBLICATIONS

Office Action dated Nov. 22, 2025 for Chinese Patent Application
No. 202210727635.6 and its English translation from Global Dossier.

* cited by examiner

[FIG. 1]
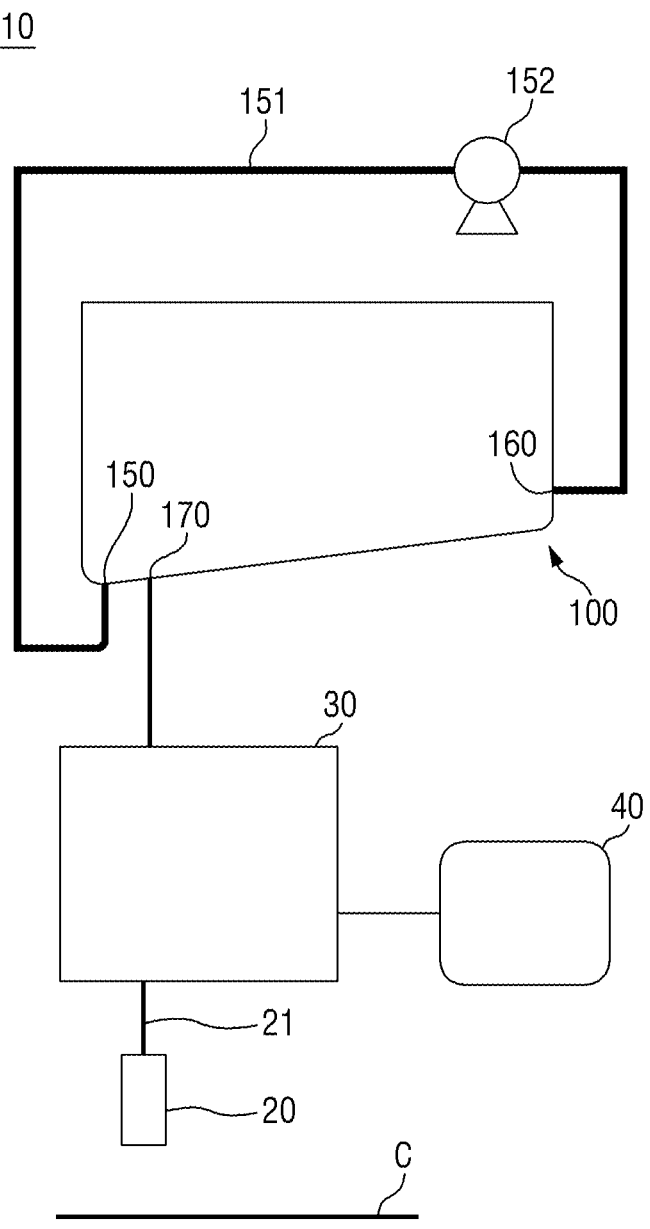

[FIG. 2]
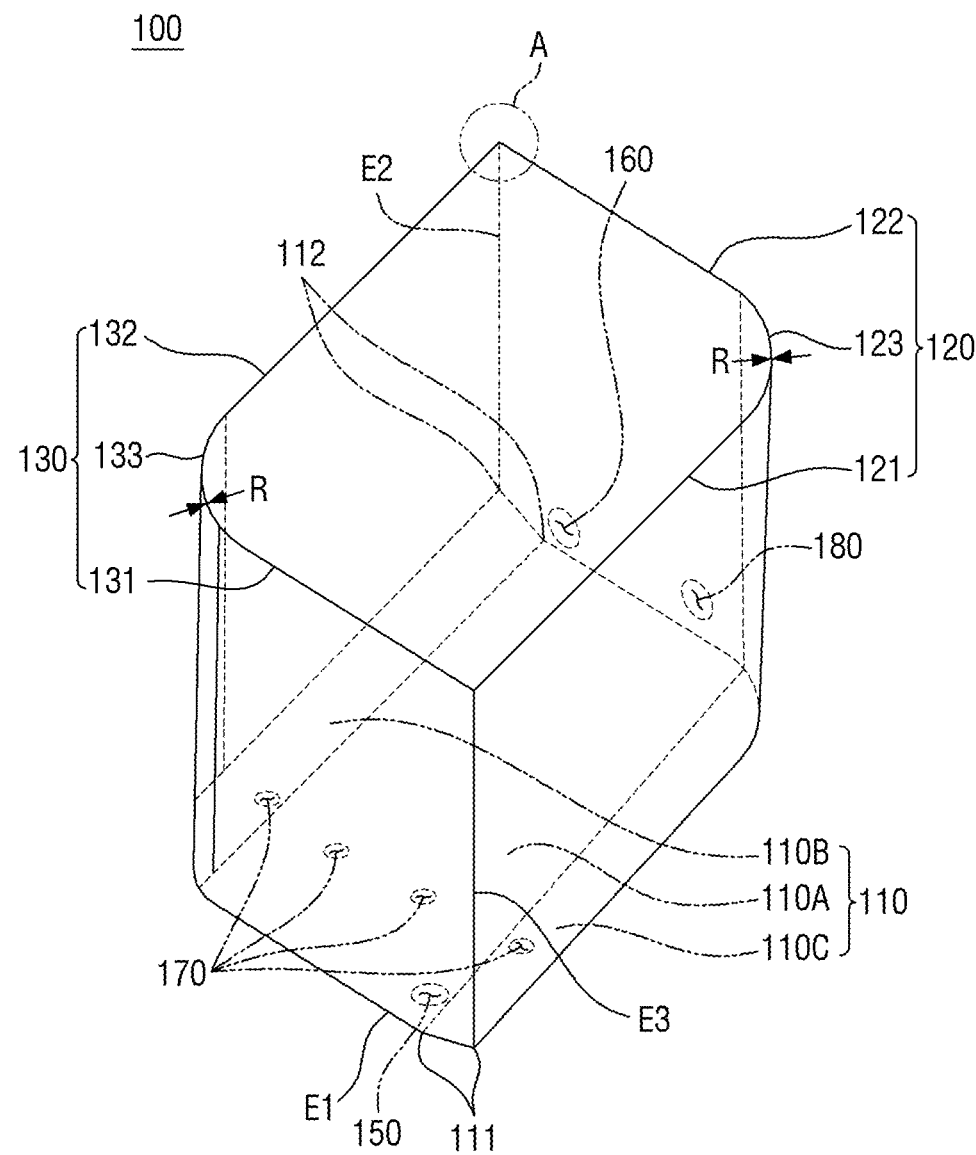

[FIG. 3]
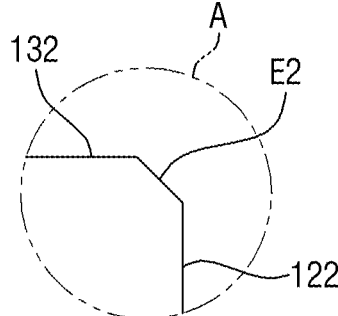
[FIG. 4]
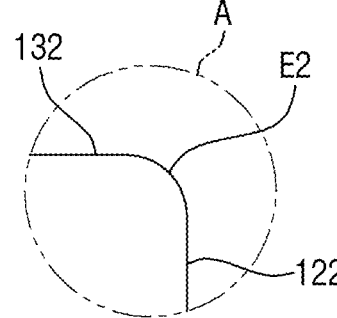

[FIG. 5]
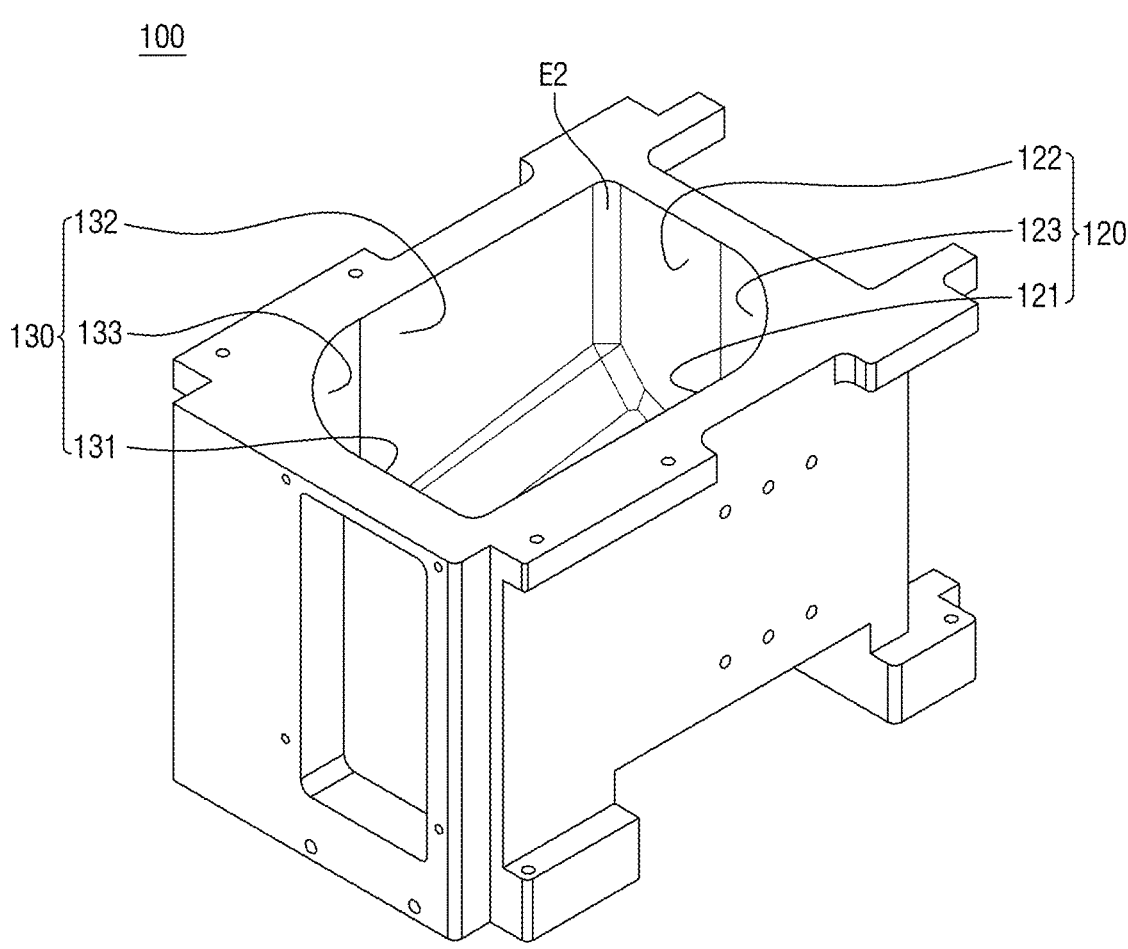

[FIG. 6]
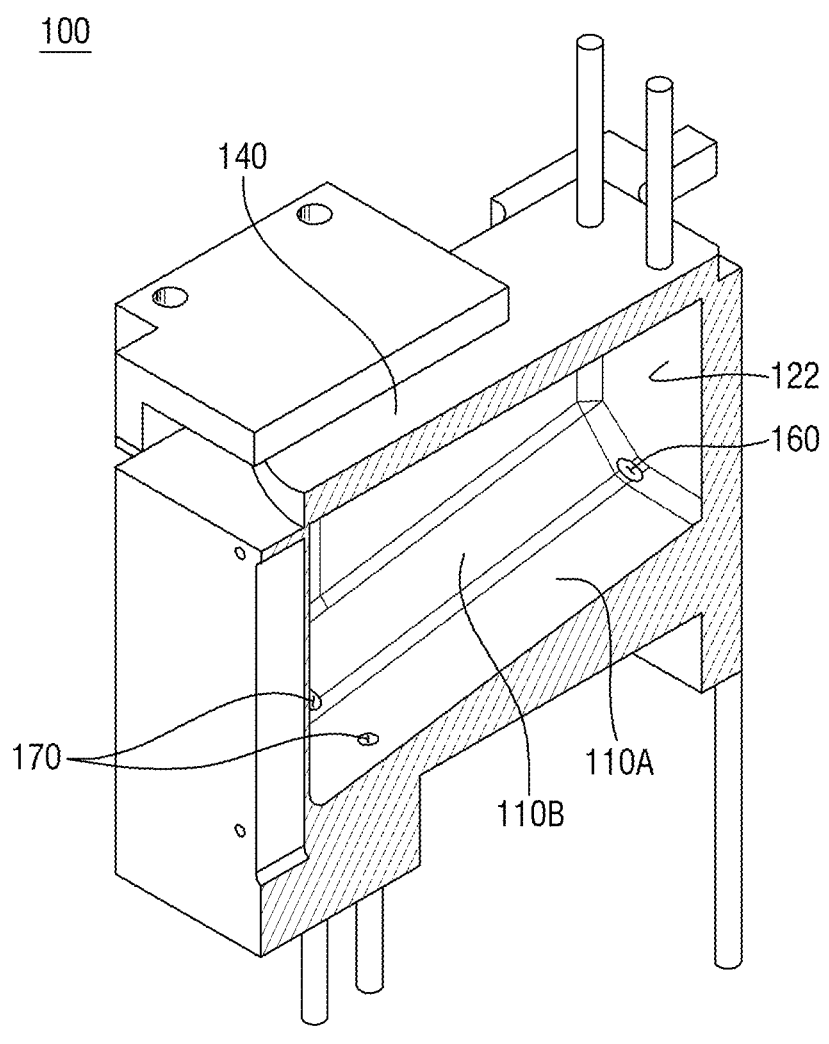

[FIG. 7]
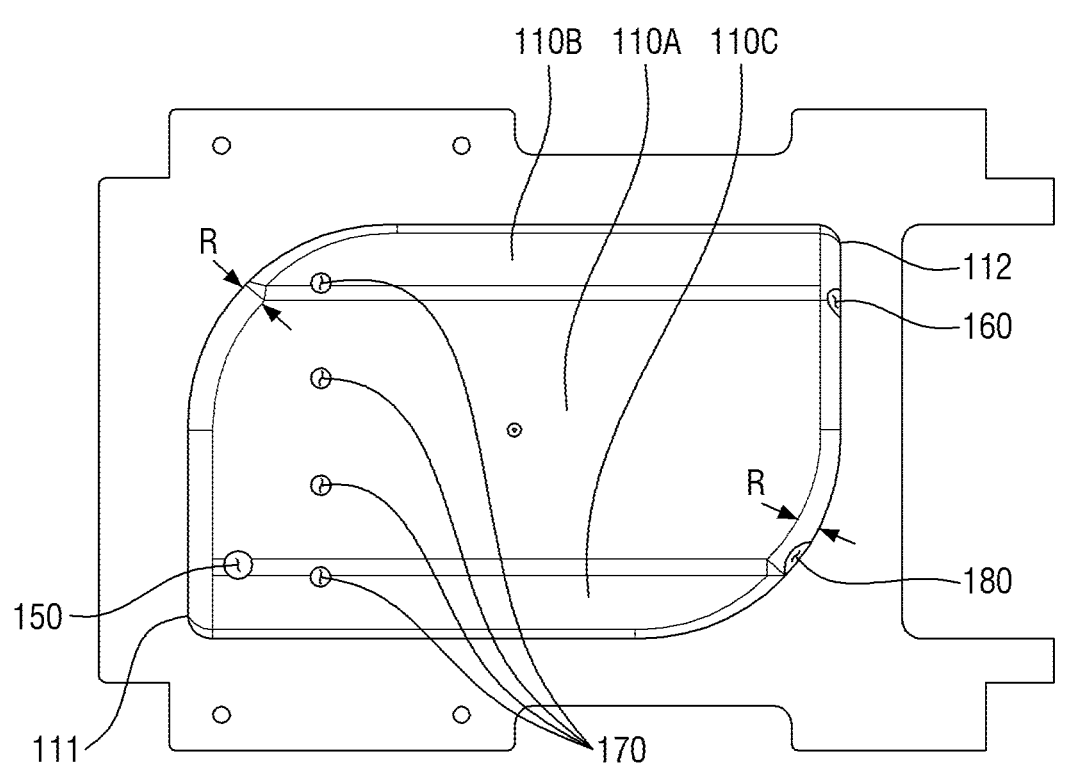

[FIG. 8]
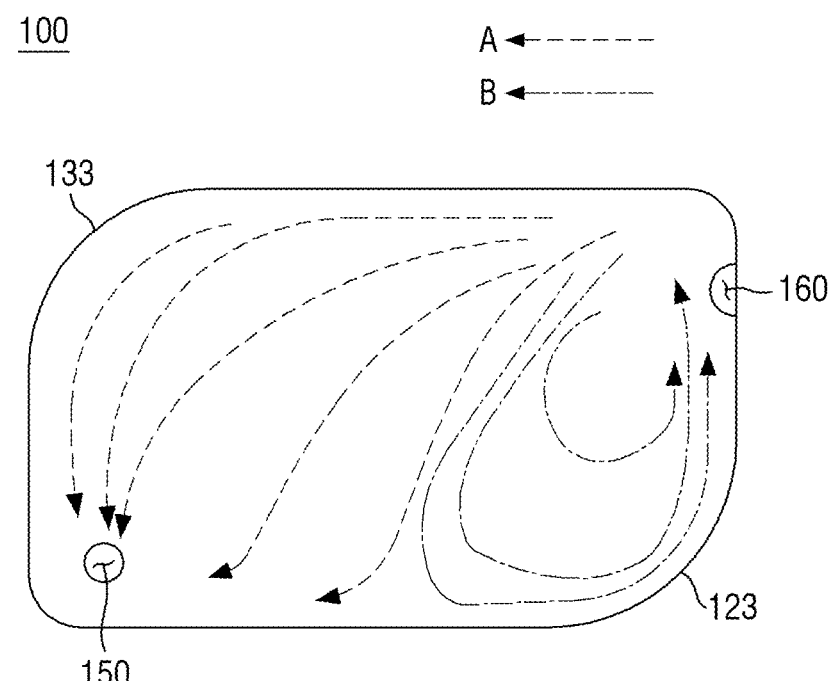

[FIG. 9]
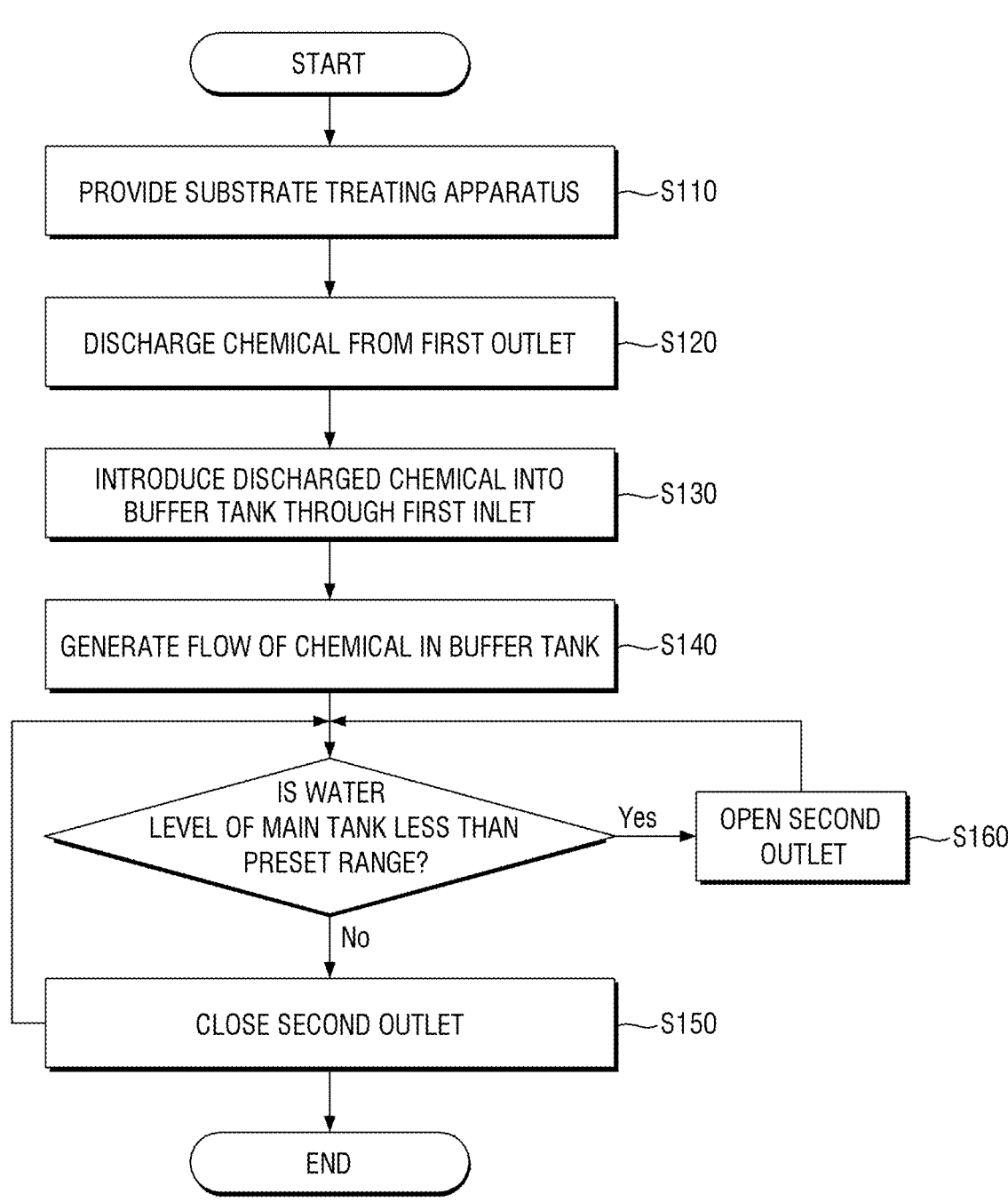

SUBSTRATE TREATING APPARATUS AND SUBSTRATE TREATING METHOD

CROSS-REFERENCE TO RELATED APPLICATION

This application claims priority from Korean Patent Application No. 10-2021-0099089 filed on Jul. 28, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate treating apparatus and a substrate treating method.

2. Description of the Related Art

In general, a substrate treating apparatus that performs a predetermined treating process such as treating a chemical on a substrate is used to manufacture a semiconductor, a display, or the like. The substrate treating apparatus includes an inkjet head for jetting a chemical to a substrate, and a reservoir (main tank) for storing the chemical supplied to the inkjet head.

In addition, the substrate treating apparatus may be configured to jet the chemical to the substrate while the inkjet head moves in a horizontal direction, and may be configured to move the reservoir in the same direction together with the inkjet head.

In addition, in the manufacture of recent display elements, a chemical containing nano-particles is handled. However, when the nano-particles settle into the reservoir, defective products may occur. Therefore, efforts are being made to develop a technology for preventing the particles of the chemical from being settled in the reservoir.

SUMMARY

On the other hand, with respect to the reservoir (main tank), a technique for preventing the chemical from being settled in the reservoir has been developed, but the improvement of a buffer tank for supplying the chemical to a plurality of reservoirs is insufficient.

Aspects of the present disclosure provide a substrate treating apparatus and a substrate treating method capable of preventing particles of a chemical stored in the buffer tank from being settled.

Aspects of the present disclosure are not limited to the aspects mentioned above, and other aspects not mentioned will be clearly understood by those skilled in the art from the following description.

According to an aspect of the present disclosure, there is provided a substrate treating apparatus including: a main tank in which a chemical for supplying to an inkjet head is stored; and a buffer tank including a space for storing the chemical to be supplied to the main tank, including a first outlet through which the chemical is discharged, a first inlet through which the chemical is introduced while forming a closed path with the first outlet so that the chemical is circulated without passing through the main tank, and second outlets for supplying the chemical to the main tank, and including a floor surface including a first vertex and a second vertex disposed to be spaced apart from the first vertex, wherein the first outlet is provided at a position closer to the first vertex than the second vertex, and the first inlet is provided at a position closer to the second vertex than the first vertex.

The buffer tank may include a first wall surface connected to the floor surface, a second wall surface connected to the floor surface and opposing the first wall surface, and a ceiling surface connected to the first wall surface and the second wall surface and opposing the floor surface, the floor surface may be inclined so that the first vertex is positioned below the second vertex, the first outlet may be formed on the floor surface, and the first inlet may be formed on the first wall or the second wall and may be provided at a position higher than the first outlet.

The first wall surface may include a first surface connected to the first vertex; a second surface connected to the second vertex; and a first curved surface connecting the first surface and the second surface to each other.

The second wall surface may include a third surface connected to the first vertex; a fourth surface connected to the second vertex; and a second curved surface connecting the third surface and the fourth surface to each other.

The first outlet may be closer to a corner where the floor surface and the third surface meet than the second outlet, and may be provided at a position lower than the second outlet.

At least one of the second outlets may be formed on the floor surface and may be formed at a position closer to the first vertex than the second vertex.

The buffer tank may further include a second inlet to which the chemical is supplied so that the buffer tank is filled with the chemical, and the second inlet may be provided on the same surface as the first inlet.

The first outlet may be formed to be larger than the second outlet, and may have a cross-sectional area difference of 10% or less from the first inlet or may be formed to have the same size as the first inlet.

The inkjet head, the main tank, and the buffer tank are provided sequentially from the bottom to the top, such that the chemical may be supplied from the buffer tank to the main tank by gravity, and the chemical may be supplied from the main tank to the inkjet head by gravity.

According to another aspect of the present disclosure, there is provide a substrate treating apparatus including: a main tank in which a chemical for supplying to an inkjet head is stored; and a buffer tank including a space for storing a chemical to be supplied to the main tank, a floor surface having a first vertex and a second vertex diagonally opposing the first vertex and to which curved surfaces provided to be adjacent to the first vertex and the second vertex and to diagonally oppose each other are connected, a first outlet through which the chemical is discharged, a first inlet through which the chemical is introduced while forming a closed path with the first outlet so that the chemical is circulated, and second outlets for supplying the chemical to the main tank.

The curved surface may be formed by round machining having a radius of 15 mm to 90 mm.

The first outlet may be provided at a position closer to the first vertex than the second vertex, and the first inlet may be provided at a position closer to the second vertex than the first vertex.

According to still another aspect of the present disclosure, there is provided a substrate treating method including: providing a buffer tank including a floor surface having a first vertex and a second vertex diagonally opposing the first vertex, to which curved surfaces provided to be adjacent to the first vertex and the second vertex and to diagonally oppose each other are connected, and having an inclination, a first outlet through which the chemical is discharged, a first inlet through which the chemical is introduced while forming a closed path with the first outlet so that the chemical is circulated, and second outlets for supplying the chemical to a main tank for supplying the chemical to an inkjet head; discharging the chemical from the first outlet; introducing the discharged chemical into the buffer tank through the first inlet; and generating a flow of the chemical in the buffer tank by moving the introduced chemical along the curved surface or moving toward the first outlet.

In the generating of the flow of the chemical, the first outlet is provided to be closer to the first vertex than to the second vertex, and the first inlet is provided to be closer to the second vertex than to the first vertex, so that a flow in which the chemical is diagonally moved from the first inlet toward the first outlet may be generated.

The substrate treating method may further include, after the generating of the flow of the chemical, opening the second outlets.

The substrate treating method may further include, before the opening of the second outlets, closing the second outlets when a water level of the main tank is a preset range or higher.

The details of other exemplary embodiments are included in the detailed description and drawings.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a view conceptually illustrating a substrate treating apparatus according to some exemplary embodiments of the present disclosure;

FIG. 2 is a view conceptually illustrating a buffer tank of the substrate treating apparatus according to some exemplary embodiments of the present disclosure;

FIG. 3 is a view illustrating a first modified example of 'A' of FIG. 2;

FIG. 4 is a view illustrating a second modified example of 'A' of FIG. 2;

FIG. 5 is a perspective view illustrating the buffer tank of the substrate treating apparatus according to an exemplary embodiment of the present disclosure;

FIG. 6 is a view illustrating a state in which the buffer tank of FIG. 5 is cut in a vertical direction of a long axis;

FIG. 7 is a view illustrating a lower view of the buffer tank of FIG. 5;

FIG. 8 is a view illustrating a flow of a chemical passing through the buffer tank of the substrate treating apparatus according to an exemplary embodiment of the present disclosure; and FIG. 9 is a flowchart for describing a substrate treating method according to an exemplary embodiment of the present disclosure.

DETAILED DESCRIPTION OF THE EMBODIMENTS

Hereinafter, exemplary embodiments of the present disclosure will be described in detail with reference to the accompanying drawings. Advantages and features of the present disclosure and methods of achieving the same will become apparent with reference to the exemplary embodiments described below in detail in conjunction with the accompanying drawings. However, the present disclosure is not limited to embodiments to be described below, but may be implemented in various different forms, these exemplary embodiments will be provided only in order to make the present disclosure complete and allow those skilled in the art to completely recognize the scope of the present disclosure, and the present disclosure will be defined by the scope of the claims. Throughout the specification, the same components will be denoted by the same reference numerals.

A phrase "one element or layer 'on' another element or layer" includes both of a case where one element or layer is directly on another element or layer and a case where one element or layer is on another element or layer with the other layer or element interposed therebetween. On the other hand, a phrase "one element or layer 'directly on' another element or layer" indicates that one element or layer is on another element or layer without the other layer or element interposed therebetween.

Terms "first", "second" and the like are used to describe various elements, components, and/or sections but these elements, components, and/or sections are not limited by these terms. These terms are used only in order to distinguish one element, component, or section from another element, component or section. Accordingly, a first element, a first component, or a first section mentioned below may also be a second element, a second component, or a second section within the spirit of the present disclosure.

The terms used herein are for the purpose of describing the exemplary embodiments and are not intended to limit the present disclosure. In the present specification, a singular form includes a plural form unless explicitly stated otherwise. Components, steps, operations, and/or elements mentioned by the terms "comprise" and/or "comprising" used in the present disclosure do not exclude the existence or addition of one or more other components, steps, operations, and/or elements.

FIG. 1 is a view conceptually illustrating a substrate treating apparatus according to some exemplary embodiments of the present disclosure and FIG. 2 is a view conceptually illustrating a buffer tank of the substrate treating apparatus according to some exemplary embodiments of the present disclosure. In addition, FIGS. 3 and 4 are views illustrating first and second modified examples of 'A' of FIG. 2.

Furthermore, FIGS. 5 to 7 are views for describing the buffer tank of the substrate treating apparatus according to an exemplary embodiment of the present disclosure, and FIG. 8 is a view illustrating a flow of a chemical passing through the buffer tank of the substrate treating apparatus according to an exemplary embodiment of the present disclosure.

Referring to FIGS. 1 to 8, the substrate treating apparatus 10 according to an exemplary embodiment of the present disclosure may include an inkjet head 20, a main tank 30, and a buffer tank 100.

The inkjet head 20 may receive a chemical from the main tank 30 and jet the chemical to a substrate C. For example, the inkjet head 20 may include a plurality of nozzles for jetting the chemical onto the substrate C, and various changes in configuration thereof are possible.

In addition, although not illustrated in the drawings, the inkjet head 20 may be connected to a head operating unit (not illustrated) to evenly jet the chemical onto the substrate C. The head operating unit may simply move the inkjet head 20 in the X-axis, Y-axis, and Z-axis directions. That is, the head operating unit may adjust a vertical height of the inkjet head 20 as well as move the inkjet head 20 in a horizontal direction. Such a head operating unit may include configurations such as a gantry and a motor, and an operating mechanism of the head operating unit is omitted in lieu of a known art.

In addition, the inkjet head 20 may be moved together with the main tank 30, so that a length of a supply line 21 through which the chemical is supplied from the main tank 30 to the inkjet head 20 may be minimized. Therefore, it is possible to minimize a problem that a pipeline of the supply line 21 is completely or partially clogged due to aggregation or settling of particles in the chemical, and process defects caused by such a problem, but the present disclosure is not limited thereto and various modified examples are possible.

In addition, the inkjet head 20, the main tank 30, and the buffer tank 100 may be sequentially provided from the bottom to the top. Accordingly, the chemical may be supplied from the buffer tank 100 to the main tank 30 by gravity. In addition, the chemical may be supplied from the main tank 30 to the inkjet head 20 by gravity, but various modified examples are possible according to the change in the configuration.

The main tank 30 may store a chemical to be supplied to the inkjet head 20, and one or more main tanks 30 may be provided. In addition, as mentioned above, the main tank 30 may be provided above the inkjet head 20 so that the chemical may be supplied to the inkjet head 20 without using a separate device such as a pump.

However, since the chemical is not always supplied from the main tank 30 to the inkjet head 20 according to a jetting operation of the chemical, it is necessary to block a flow of the chemical by gravity. To this end, the main tank 30 may be connected to a pressure adjusting unit 40, and the pressure adjusting unit 40 may adjust a pressure in the main tank 30.

Here, whether or not the chemical is supplied by the pressure adjusting unit 40 is briefly that the pressure adjusting unit 40 forms a negative pressure inside the main tank 30 to block the supply of the chemical, and forms a positive pressure in the main tank 30 to allow the supply of the chemical.

Since the main tank 30 directly supplies the chemical to the inkjet head 20, it is difficult to fill the main tank 30 with the chemical during a chemical application operation. This is because the negative pressure needs to be maintained when the chemical is supplied from the main tank 30 to the inkjet head 20 as mentioned above. Accordingly, when the main tank 30 needs to be filled with the chemical, the state in which the main tank 30 communicates with the buffer tank 100 may be released, which will be described later.

The buffer tank 100 may have a space in which the chemical to be provided to the main tank 30 is stored, and may be filled with the chemical from the outside or a separate tank, regardless of the main tank 30 that needs to maintain a negative pressure state. In addition, one buffer tank 100 may communicate with a plurality of main tanks 30. For example, the buffer tank 100 may have a larger capacity of 10% or more compared to one main tank 30.

In particular, in the buffer tank 100 according to the present exemplary embodiment, the chemical may be circulated so that the flow of the chemical is formed regardless of the operation of jetting the chemical to the substrate C, so that the problem of settling of the particles in the chemical may be minimized or prevented.

Briefly, the buffer tank 100 may include a first outlet 150 through which the chemical is discharged and a first inlet 160 through which the chemical is introduced. In this case, the first outlet 150 and the first inlet 160 form a closed path without passing through the main tank 30, so that the chemical may be circulated regardless of the jetting of the chemical from the main tank 30.

The buffer tank 100 may have a shape in which the settling problem is further prevented compared to a structure that only circulates the chemical while the space is expanded compared to a cylinder. For example, the buffer tank 100 may have a structure in which two corners form a curved surface (which may be a first curved surface 123 and a second curved surface 133) of the round machining (45R) having a radius of 45 mm, for example, while forming a rectangular parallelepiped so that a difference from a storage capacity required in a conventional buffer tank is not large. In addition, it should be noted that each of 45R, 15R, and 90R described in the present exemplary embodiment may mean the round machining having a radius of 45 mm, 15 mm, and 90 mm.

Specifically, the buffer tank 100 may include a floor surface 110, a first wall surface 120, a second wall surface 130, a ceiling surface 140, a first outlet 150, a first inlet 160, a second outlet 170, and a second inlet 180.

First, the floor surface 110 may be inclined so that the chemical may flow from one side (which may be an area adjacent to the second surface 122) to the other side (which may be an area adjacent to the third surface 131), thereby, guiding the flow of the chemical.

For example, the floor surface 110 may have a structure in which a plurality of plates are connected to each other so that the chemical may be collected on the other side of a bottom surface. The plurality of plates may include a central plate 110A provided in the center, a left plate 110B provided on the left side of the central plate 110A, and a right plate 110C provided on the right side of the central plate 110A. Here, the central plate 110A may be inclined downward from one side to the other side. In addition, the left plate 110B and the right plate 110C may have a structure in which the chemical is collected in the central plate 110A by forming a shape spreading from the central plate 110A.

In addition, the floor surface 110 may include a first vertex 111 and a second vertex 112, and the second vertex 112 may be spaced apart from the first vertex 111 to oppose each other diagonally. Accordingly, the buffer tank 100 may have a space formed to extend to the first vertex 111 and the second vertex 112 compared to a structure in which a cross section of the buffer tank 100 forms a circular shape, that is, compared to a radius of the circular shape. Accordingly, the buffer tank 100 may secure a sufficient space in which the chemical may be stored.

In addition, the floor surface 110 may be inclined so that the first vertex 111 is positioned below the second vertex 112. When the floor surface 110 has a structure of the plurality of plates, the first vertex 111 and the second vertex 112 may be provided at positions opposite to the vertices of the ceiling surface 140. Alternatively, vertices of the central plate 110A may form the first vertex 111 and the second vertex 112. Alternatively, those described above are combined, so that each of the first vertex 111 and the second vertex 112 may include a plurality of vertices. For example, as the first vertex 111 may form both vertices of the right plate 110C and the second vertex 112 may form both vertices of the left plate 110B, various modified examples are possible.

The first wall surface 120, which is a configuration constituting a peripheral wall of the buffer tank 100 together with the second wall surface 130, may be connected to the floor surface 110, and at least a portion thereof may form a curved surface. For example, the first wall surface 120 may include a first surface 121, a second surface 122, and a first curved surface 123.

For example, the first surface 121 may be formed as one surface and may be connected to the first vertex 111. The second surface 122 may be provided as one surface provided in a direction perpendicular to the first surface 121 and may be connected to the second vertex 112.

In addition, the first curved surface 123 may connect the first surface 121 and the second surface 122 to each other, and may be formed by round machining (15R to 90R) having a radius of 15 mm to 90 mm to form a shape in which a dead zone is not formed in the flow of the chemical. For example, the first curved surface 123 may be formed by round machining (45R) having a radius of 45 mm. In addition, the flow of the chemical by the round machining structure in which the radius of the first curved surface 123 is 45 mm will be described later with reference to FIG. 8.

The second wall surface 130, which is a configuration that forms the remaining peripheral wall of the first wall surface 120 in the peripheral wall of the buffer tank 100, may oppose the first wall surface 120 and may be connected to the floor surface 110. For example, the second wall surface 130 may include a third surface 131, a fourth surface 132, and a second curved surface 133.

For example, the third surface 131 may be provided as one surface opposite to the second surface 122 and may be connected to the first vertex 111. The fourth surface 132 may be provided as one surface opposite to the first surface 121 and may be connected to the second vertex 112.

In addition, the second curved surface 133 may connect the third surface 131 and the fourth surface 132 to each other, and may be formed by round machining (15R to 90R) having a radius of 15 mm to 90 mm in the same or similar manner as the first curved surface 123. The second curved surface 133 may form a flow of the chemical in a form in which the dead zone is reduced or not generated in the same or similar manner as the first curved surface 123, unlike the dead zone being formed in a structure formed at a right angle in the same or similar manner as the first curved surface 123.

Since the first wall surface 120 and the second wall surface 130 are connected to each other to form the peripheral wall of the buffer tank 100, corners (see FIGS. 2, E2 and E3) may be formed at points where the first wall surface 120 and the second wall surface 130 meet.

However, as illustrated in FIGS. 3 to 5, the corners E2 and E3 may be chamfered so that the first wall surface 120 and the second wall surface 130 do not meet at a right angle, and a connection point thereof may have an obtuse angle or may be formed as a smooth connection surface such as a curved surface. Therefore, since the corners E2 and E3 may have an extended angle compared to a right angle, adsorption of particles of the chemical may be minimized or prevented.

In addition, all corners referred to in the present specification refer to points where two surfaces such as the first wall surface 120 and the second wall surface 130 meet, and thus are not limited to lines meeting at a right angle. In addition, all corners formed in the buffer tank 100 of the present exemplary embodiment do not form a right angle but are chamfered, and the connection point thereof may have an obtuse angle or may be treated as a smooth connection surface such as a curved surface.

Furthermore, the corners such as 'E2 and E3' where the two surfaces such as the first wall surface 120 and the second wall surface 130 meet, may be formed by round machining (5R) having a radius of 5 mm or less, and may be distinguished from the first curved surface 123 and the second curved surface 133 formed by round machining having a radius of 15 mm or more.

In other words, since the corners such as 'E2 and E3' are rounded with a radius of 5 mm or less, the buffer tank 100 may form only the smooth connection surface that prevents the adsorption of particles while forming a sufficient space, and may be formed regardless of the flow of the chemical. Unlike this, since the first curved surface 123 and the second curved surface 133 may have some sections of the buffer tank 100 formed by the round machining having the radius of 15 mm or more so that a dead zone does not occur in the flow of the chemical, this is different from the corners described above.

In addition, round-machining the corners such as 'E2 and E3' to 5 mm or less is because the flow of the chemical without the dead zone is generated by an inflow pressure and an outflow pressure at the first vertex 111 and the second vertex 112 that may be formed in the corners such as 'E2 and E3'. Accordingly, it may be desirable that a curvature be formed with a radius of 5 mm or less in order to increase a volume, without the need for the curvature to be formed with a radius of 15 mm or more in the areas of the corners such as 'E2 and E3'.

The ceiling surface 140 may be connected to the first wall surface 120 and the second wall surface 130, and may oppose the floor surface 110. In addition, since the ceiling surface 140 may not guide the chemical unlike the floor surface 110, the ceiling surface 140 may be parallel to the ground without forming an inclined surface. However, the present disclosure is not limited thereto, and various modified examples are possible according to a change in the configuration.

The first outlet 150, which is a configuration provided for chemical circulation, may be formed on the floor surface 110. Furthermore, the first outlet 150 may be formed at a position closer to the first vertex 111 than the second vertex 112. Therefore, the first outlet 150 may easily discharge the chemical moving to the other side along the floor surface 110, thereby making it possible to smoothly flow the chemical.

In addition, the first outlet 150 may be closer than the second outlet 170 to the corner E1 where the floor surface 110 and the third surface 131 meet so as to be provided at a lower position than the second outlet 170. The first outlet 150 may discharge the chemical at a lower position than the second outlet 170 even if the chemical is not discharged through the second outlet 170. Therefore, even if the chemical is not supplied to the main tank 30, the chemical may be discharged through the first outlet 150 at the lower position than the second outlet 170. Accordingly, since the flow of the chemical may be smoothly made, the chemical may flow without the dead zone around the second outlet 170.

In addition, the first outlet 150 may be formed to be larger than one second outlet 170. Accordingly, since the amount of the chemical discharged through the first outlet 150 may be large compared to the chemical discharged through the one second outlet 170, the chemical may be smoothly circulated regardless of the supply of the chemical to the main tank 30, but this is only an example.

In addition, the first outlet 150 may have a cross-sectional area difference of 10% or less from or the same size as that of the first inlet 160. Accordingly, even if the chemical is not supplied to the main tank 30, since the amount of the chemical supplied through the first inlet 160 and the chemical discharged through the first outlet 150 may be formed to be the same/similar, a water level of the chemical in the buffer tank 100 may be constantly maintained. However, this is only an example, and diameters of the first outlet 150 and the first inlet 160 may be variously modified according to a change in the configuration.

Furthermore, the first outlet 150 may be provided adjacent to the first vertex 111 rather than the second vertex 112. Since the chemical is discharged through the first outlet 150 to generate a discharge pressure at the first outlet 150, stagnation of the chemical may be prevented. Therefore, the corner at which the first vertex 111 is positioned may be round-machined with the radius of 5 mm or less to secure a space for the buffer tank 100.

The first inlet 160, which is a configuration provided for chemical circulation, may be formed on the first wall surface 120 or the second wall surface 130, and preferably may be formed on the second surface 122 of the first wall surface 120. In addition, the first inlet 160 may be provided at a higher position than the first outlet 150, and may be provided adjacent to the second vertex 112 compared to the first vertex 111. Therefore, since the chemical supplied through the first inlet 160 may naturally move downward due to gravity inside the buffer tank 100 and be discharged through the first outlet 150, the flow of the chemical may be smoothly made.

In addition, since the first inlet 160 is a configuration to which the chemical is supplied, the first inlet 160 may form a point at which the flow of the chemical starts. The first inlet 160 may be provided on the second surface 122 to be in contact with the floor surface 110. In addition, the first inlet 160 may be provided in a boundary area between the floor surface 110 and the second surface 122, and may be provided in a corner area as illustrated in FIG. 6. For example, the first inlet 160 may penetrate through in a direction parallel to the ground or parallel to the floor surface 110 from the second surface 122, without penetrating from the lower direction to the upper direction. In addition, since the inflow pressure due to the inflow of the chemical may be generated at the first inlet 160, the chemical introduced through the first inlet 160 may be jetted in a horizontal direction with respect to the floor surface 110, not in the form of being discharged in the upper direction.

In addition, since the inflow pressure is formed at the first inlet 160, it is possible to prevent a dead zone from being formed around the second vertex 112. Since a periphery of the first inlet 160 does not need to form the curved surface, the second vertex 112 at which the first inlet 160 is positioned may be round-machined with the radius of 5 mm or less so that the space of the buffer tank 100 is expanded.

The first outlet 150 and the first inlet 160 may be positioned diagonally. Therefore, since no dead zones are formed at the first outlet 150 and the first inlet 160 compared to the case in which the dead zone in which particles are stagnated is formed at four vertices in the buffer tank 100 having a rectangular horizontal cross section, the number of dead zones may be reduced from four areas to two areas. Here, the remaining two areas spaced apart from the first outlet 150 and the first inlet 160 are provided with the first curved surface 123 and the second curved surface 133 as mentioned above. Therefore, since the dead zone is omitted from the remaining areas of the first outlet 150 and the first inlet 160, the dead zone may not be generated in the buffer tank 100 as a whole.

In addition, the first outlet 150 and the first inlet 160 may be provided on the floor surface 110 or may be provided to be in contact with the floor surface 110, so that circulation of the chemical may be formed on the floor surface 110. Accordingly, with respect to the water surface of the buffer tank 100, the level of which needs to be sensitively adjusted, sloshing of the chemical may be prevented.

In addition, a circulation line 151 may be provided between the first outlet 150 and the first inlet 160 so that the chemical is circulated through the first outlet 150 and the first inlet 160. In addition, a pump 152 may be provided on the circulation line 151. Accordingly, the circulation line 151 may be formed to be longer than the supply line 21, but the particles may be prevented from being settled on the circulation line 151 due to a forced flow by the pump 152. In addition, various modified examples are possible, such as a filter, a flow device, and the like that may also be provided between an outlet of the pump 152 and the first inlet 160.

One or more second outlets 170 that are configured to supply/discharge the chemical to the main tank 30 may be formed on the floor surface 110. For example, as illustrated in FIG. 7, four second outlets 170 may be provided, which is to be formed to be equal to the number of main tanks 30. Accordingly, as the number of the second outlets 170 may be changed according to a change in the number of the main tank 30, various modified examples are possible.

In addition, for example, the second outlet 170 may be formed at a position closer to the first vertex 111 than the second vertex 112, and may be formed at a lower position of an inclined floor surface 110. Therefore, in the buffer tank 100, the remaining amount of the chemical may be minimized, and the chemical is discharged not only through the first outlet 150 but also through the second outlet 170, so that the flow of the chemical may be smoothly formed.

In addition, since the second outlet 170 may be opened only when the chemical is supplied to the main tank 30, the second outlet 170 may be in a closed state in the chemical application process of the inkjet head 20 as mentioned above. Accordingly, since the negative pressure may be maintained in the main tank 30, the buffer tank 100 may be filled during the chemical application process.

The chemical may be introduced through the second inlet 180 so that the buffer tank 100 may be filled with the chemical supplied from the outside or a separate tank. For example, the second inlet 180 may be provided on the same surface as the first inlet 160, and may be formed on the second surface 122 of the first wall surface 120. This is to allow the flow of the chemical to be naturally formed in an inclined direction along the floor surface 110, but the present disclosure is not limited thereto.

As described above, in the buffer tank 100, since the flow of the chemical according to the outflow pressure and the inflow pressure is formed over the entire floor surface 110, the settling of the particles may be reduced due to the flow of the chemical, and the dead zone may not be generated, thereby further reducing the settling of the particles.

In addition, a flow of the chemical in a round machining structure of a radius of 45 mm of the first curved surface 123 and the second curved surface 133, which are not described, is as follows.

As illustrated in FIG. 8, a chemical introduced into the buffer tank 100 through the first inlet 160 may have a flow 'A' discharged through the first outlet 150. In this case, the flow of the chemical may be guided adjacent to the second curved surface 133 and along a shape of the second curved surface 133.

In addition, the chemical introduced into the buffer tank 100 through the first inlet 160 may not be discharged through the first outlet 150 but may form a swirl flow to have a flow 'B'. In this case, the flow of the chemical may be guided adjacent to the first curved surface 123 and along a shape of the first curved surface 123.

However, as illustrated in FIG. 8, the curvature of the first curved surface 123 and the second curved surface 133 may be formed by the round machining in a radius range of 15 mm to 90 mm as mentioned above, in addition to the round machining with a radius of 45 mm. Here, when the curvature of the first curved surface 123 and the second curved surface 133 has a large radius, such as the round machining with the radius of 90 mm, for example, the volume (the storage capacity of the buffer tank 100) is reduced. As a result, the flow 'B' forming the swirl flow illustrated in FIG. 8 may not be generated.

In addition, when the flow of the chemical occurs without the dead zone on the floor surface 110 even if the flow 'B' does not occur, the setting of particles may not occur. Therefore, the flow of the chemical does not matter even if only the flow 'A' occurs without the flow 'B'. Accordingly, various modified examples having a structure in which both the flow 'A' and the flow 'B' occur or only the flow 'A' occurs so that the flow of the chemical occurs without the dead zone on the floor surface 110 are possible.

Meanwhile, when the curvature of the first curved surface 123 and the second curved surface 133 is formed with a radius of less than 15 mm, the dead zone may occur due to the insignificant or non-existent effect of the outflow pressure and the inflow pressure. Therefore, round machining in which the curvature of the first curved surface 123 and the second curved surface 133 is formed to a radius of 15 mm or more is preferable. In addition, when the curvature of the first curved surface 123 and the second curved surface 133 exceeds a radius of 90 mm, it may be difficult to form a required volume due to an excessive curvature.

Accordingly, in the present exemplary embodiment, the curvature of the first curved surface 123 and the second curved surface 133 may be in a radius range of 15 mm to 90 mm, and preferably may be formed by round machining with a radius of 45 mm so that the storage capacity of the buffer tank 100 meets the capacity required by the substrate treating apparatus 10 while minimizing or preventing the settling of particles due to the dead zone.

In the substrate treating apparatus 10 according to the exemplary embodiment as described above, since the chemical in the buffer tank 100 is circulated, it is possible to prevent the particles of the chemical from being settled, and thus an occurrence of defective products may be minimized or prevented.

In particular, since the outflow pressure is generated when the chemical is discharged from the first outlet 150, and the inflow pressure is generated when the chemical is introduced into the first inlet 160, the flow of the chemical is formed on the floor surface 110 on which the particles of the chemical may be settled, so that the settling of the particles may be reduced. In addition, the first outlet 150 and the first inlet 160 may be positioned diagonally. Therefore, since no dead zones are formed at the first outlet 150 and the first inlet 160 compared to the case in which the dead zone is formed at four corners in the buffer tank 100 having a rectangular horizontal cross section, the number of dead zones may be reduced from four areas to two areas.

Further, since the first curved surface 123 and the second curved surface 133 are provided in the remaining two areas where the dead zone may be formed, that is, in the area in which the first outlet 150 and the first inlet 160 are not provided, the dead zone in which the chemical is stagnated may be minimized.

Hereinafter, a substrate treating method using the substrate treating apparatus 10 of the present exemplary embodiment will be described with reference to the drawings. In addition, since the configuration of the substrate treating apparatus 10 is the same as that of the substrate treating apparatus 10 described above, overlapping contents will be omitted.

FIG. 9 is a flowchart for describing a substrate treating method according to an exemplary embodiment of the present disclosure.

Referring to FIG. 9, a substrate treating method according to the present exemplary embodiment may include a step (S110) of providing a substrate treating apparatus so that the substrate treating apparatus 10 described above may be used, a step (S120) of discharging a chemical from a first outlet 150, a step (S130) of introducing the discharged chemical into a buffer tank 100 through a first inlet 160, a step (S140) of generating a flow of the chemical in the buffer tank 100 by moving the introduced chemical along curved surfaces (a first curved surface 123 and a second curved surface 133) or moving toward the first outlet 150, a step (S150) of closing a second outlet 170 when a water level of a main tank 30 is a preset range or higher, and a step (S160) of opening the second outlet 170 when the water level of the main tank 30 is less than the preset range.

First, a substrate treating apparatus 10 may be provided (S110).

As described above, the substrate treating apparatus 10 may include the inkjet head 20, the main tank 30, and the buffer tank 100. In addition, the substrate treating apparatus 10 may evenly jet the chemical solution through the inkjet head 20.

However, it may be difficult to prevent the occurrence of defective products only by evenly jetting the chemical. That is, since the particles in the chemical need to be evenly jetted onto the substrate C, it is necessary to prevent settling of the chemical in the buffer tank 100. To this end, the substrate treating apparatus 10 according to the present exemplary embodiment may be provided.

In the provided substrate treating apparatus 10, the chemical may be discharged from a first outlet 150 (S120).

As described above, the first outlet 150 may be provided to a position closer to the first vertex 111 than the second vertex 112. Accordingly, at one vertex (the first vertex 111) adjacent to the first outlet 150 among the four vertices in a quadrangular-shaped buffer tank 100, the settling of the chemical may be prevented by a discharge pressure of the chemical, so that a dead zone may not occur.

Next, the chemical discharged through the first outlet 150 may be introduced into the buffer tank 100 through the first inlet 160 via the circulation line 151 (S130).

Here, since the chemical is introduced into the first inlet 160 to generate an inflow pressure, it is possible to prevent the chemical from being settled around the first inlet 160. Therefore, in the same/similar manner as the first outlet 150, the dead zone may not occur at a vertex adjacent to the first inlet 160 (the second vertex 112) among the four vertices of the buffer tank 100.

In addition, the chemical in the buffer tank 100 may be circulated through the circulation line 151 through the first outlet 150 and the first inlet 160. In this case, the chemical circulating in the buffer tank 100 may be circulated without passing through the main tank 30 by forming a closed path with the buffer tank 100 placed thereon. Therefore, since the chemical in the buffer tank 100 may be circulated regardless of the jetting of the chemical from the main tank 30, the chemical in the buffer tank 100 may be prevented from being settled regardless of whether or not the inkjet head 20 and the main tank 30 are operated.

In addition, the chemical circulated through the first outlet 150 and the first inlet 160 is moved along curved surfaces (the first curved surface 123 and the second curved surface 133) or moved toward the first outlet 150, so that a flow of the chemical may be generated in the buffer tank 100 (S140).

The flow of the chemical may include a flow that is diagonally moved from the first inlet 160 to the first outlet 150 as described above in the substrate treating apparatus 10 (see FIG. 8, the flow 'A').

In addition, in the areas adjacent to the first outlet 150 and the first inlet 160, the first curved surface 123 and the second curved surface 133 are provided, and in particular, a dead zone may not occur due to round machining with a radius of 45 mm. Therefore, the flow of the chemical may be entirely formed on the floor surface 110 of the buffer tank 100.

In addition, according to the radius of the round machining of the first curved surface 123 and the second curved surface 133, the chemical introduced through the first inlet 160 may form a swirl flow without being discharged through the first outlet 150 to have the flow 'B' (see FIG. 8).

Meanwhile, step S140 may be performed regardless of the step of discharging the chemical from the main tank 30, as described above. That is, step S140 may be performed regardless of whether or not the second outlet 170 is closed/opened.

However, when the chemical in the main tank 30 is exhausted, it is necessary to fill the chemical. Therefore, a step for supplying the chemical whose settling is prevented through step S140 to the main tank 30 may be performed. However, since the chemical is not always supplied to the main tank 30, it may be performed by the following steps.

First, when a water level of the main tank 30 is a preset range or higher, the second outlet 170 may be closed (S150).

Here, the water level in the preset range may be set in consideration of the size and process time of the main tank 30.

When the chemical is detected by a sensor (not illustrated) as being the preset water level or higher, the main tank 30 needs to prevent the chemical from overflowing or from being unnecessarily supplied. To this end, the second outlet 170 of the buffer tank 100 may be closed so that the buffer tank 100 and the main tank 30 are disconnected. Closing of the second outlet 170 may be made by a control valve or the like, and various modified examples are possible according to a change in the configuration.

On the other hand, when the water level of the main tank 30 is less than the preset range, the second outlet 170 may be opened (S160).

When the second outlet 170 is opened by control of the control valve or the like, the main tank 30 may communicate with the buffer tank 100 to be supplied with the chemical solution from the buffer tank 100. In this case, the chemical in the buffer tank 100 may be in a state in which the chemical is continuously circulated.

Although the exemplary embodiments of the present disclosure have been described with reference to the accompanying drawings, those of ordinary skill in the art to which the present disclosure pertains will understand that the present disclosure may be embodied in other specific forms without changing the technical spirit or essential features thereof. Therefore, it should be understood that the exemplary embodiments described above are illustrative in all aspects and not restrictive.

What is claimed is:

1. A substrate treating apparatus comprising:
a main tank in which a chemical for supplying to an inkjet head is stored; and a buffer tank including a space for storing the chemical to be supplied to the main tank, including a first outlet through which the chemical is discharged, a first inlet through which the chemical is introduced while forming a closed path with the first outlet so that the chemical is circulated without passing through the main tank, and second outlets for supplying the chemical to the main tank, and including a floor surface including a first vertex and a second vertex disposed to be spaced apart from the first vertex,
wherein the first outlet is provided at a position closer to the first vertex than the second vertex, and
the first inlet is provided at a position closer to the second vertex than the first vertex.

2. The substrate treating apparatus of claim 1, wherein the buffer tank includes:
a first wall surface connected to the floor surface;
a second wall surface connected to the floor surface and opposing the first wall surface, and
a ceiling surface connected to the first wall surface and the second wall surface and opposing the floor surface,
the floor surface is inclined so that the first vertex is positioned below the second vertex,
the first outlet is formed on the floor surface, and
the first inlet is formed on the first wall or the second wall and is provided at a position higher than the first outlet.

3. The substrate treating apparatus of claim 2, wherein the first wall surface includes:
a first surface connected to the first vertex;
a second surface connected to the second vertex; and
a first curved surface connecting the first surface and the second surface to each other.

4. The substrate treating apparatus of claim 2, wherein the second wall surface includes:
a third surface connected to the first vertex;
a fourth surface connected to the second vertex; and
a second curved surface connecting the third surface and the fourth surface to each other.

5. The substrate treating apparatus of claim 4, wherein the first outlet is closer to a corner where the floor surface and the third surface meet than the second outlet, and is provided at a position lower than the second outlet.

6. The substrate treating apparatus of claim 1, wherein at least one of the second outlets is formed on the floor surface and is formed at a position closer to the first vertex than the second vertex.

7. The substrate treating apparatus of claim 1, wherein the buffer tank further includes a second inlet to which the chemical is supplied so that the buffer tank is filled with the chemical, and
the second inlet is provided on the same surface as the first inlet.

8. The substrate treating apparatus of claim 1, wherein the first outlet is formed to be larger than the second outlet, and has a cross-sectional area difference of 10% or less from the first inlet or is formed to have the same size as the first inlet.

9. The substrate treating apparatus of claim 1, wherein the inkjet head, the main tank, and the buffer tank are provided sequentially from the bottom to the top, such that chemical is supplied from the buffer tank to the main tank by gravity, and the chemical is supplied from the main tank to the inkjet head by gravity.

10. A substrate treating apparatus comprising:
a main tank in which a chemical for supplying to an inkjet head is stored; and
a buffer tank including a space for storing a chemical to be supplied to the main tank, a floor surface having a first vertex and a second vertex diagonally opposing the first vertex and to which curved surfaces provided to be adjacent to the first vertex and the second vertex and to diagonally oppose each other are connected, a first outlet through which the chemical is discharged, a first inlet through which the chemical is introduced while forming a closed path with the first outlet so that the chemical is circulated, and second outlets for supplying the chemical to the main tank.

11. The substrate treating apparatus of claim 10, wherein the curved surface is formed by round machining having a radius of 15 mm to 90 mm.

12. The substrate treating apparatus of claim 10, wherein the first outlet is provided at a position closer to the first vertex than the second vertex, and the first inlet is provided at a position closer to the second vertex than the first vertex.

13. A substrate treating method comprising:

providing a buffer tank including a floor surface having a first vertex and a second vertex diagonally opposing the first vertex, to which curved surfaces provided to be adjacent to the first vertex and the second vertex and to diagonally oppose each other are connected, and having an inclination, a first outlet through which the chemical is discharged, a first inlet through which the chemical is introduced while forming a closed path with the first outlet so that the chemical is circulated, and second outlets for supplying the chemical to a main tank for supplying the chemical to an inkjet head;

discharging the chemical from the first outlet;

introducing the discharged chemical into the buffer tank through the first inlet; and generating a flow of the chemical in the buffer tank by moving the introduced chemical along the curved surface or moving toward the first outlet.

14. The substrate treating method of claim 13, wherein in the generating of the flow of the chemical, the first outlet is provided to be closer to the first vertex than to the second vertex, and the first inlet is provided to be closer to the second vertex than to the first vertex, so that a flow in which the chemical is diagonally moved from the first inlet toward the first outlet is generated.

15. The substrate treating method of claim 13, further comprising, after the generating of the flow of the chemical, opening the second outlets.

16. The substrate treating method of claim 15, further comprising, before the opening of the second outlets, closing the second outlets when a water level of the main tank is a preset range or higher.

* * * * *